(12) United States Patent
Van Den Broeke et al.

(10) Patent No.: US 7,549,140 B2
(45) Date of Patent: Jun. 16, 2009

(54) METHOD AND APPARATUS FOR DECOMPOSING SEMICONDUCTOR DEVICE PATTERNS INTO PHASE AND CHROME REGIONS FOR CHROMELESS PHASE LITHOGRAPHY

(75) Inventors: Doug Van Den Broeke, Sunnyvale, CA (US); Jang Fung Chen, Cupertino, CA (US); Thomas Laidig, Point Richmond, CA (US); Kurt E. Wampler, Sunnyvale, CA (US); Stephen Hsu, Fremont, CA (US)

(73) Assignee: ASML Masktools B. V., Ah Veldhoven (NL)

( * ) Notice: Subject to any disclaimer, the term of this patent is extended or adjusted under 35 U.S.C. 154(b) by 492 days.

(21) Appl. No.: 11/035,737

(22) Filed: Jan. 18, 2005

(65) Prior Publication Data
US 2005/0125765 A1    Jun. 9, 2005

Related U.S. Application Data

(62) Division of application No. 10/395,903, filed on Mar. 25, 2003, now Pat. No. 6,851,103.

(60) Provisional application No. 60/366,545, filed on Mar. 25, 2002.

(51) Int. Cl.
*G06F 17/50* (2006.01)
*G06F 19/00* (2006.01)
*G21K 5/00* (2006.01)
*G03F 1/00* (2006.01)

(52) U.S. Cl. .................. 716/19; 700/120; 700/121; 430/5; 378/35

(58) Field of Classification Search .............. 716/21, 716/19; 439/5; 378/35; 250/492.22; 700/120, 700/121; 430/5
See application file for complete search history.

(56) References Cited

U.S. PATENT DOCUMENTS 5,288,568 A * 2/1994 Cathey, Jr. ............... 430/5

(Continued)

FOREIGN PATENT DOCUMENTS

JP        05-341498        12/1993

(Continued)

OTHER PUBLICATIONS

Krautschik et al., "Rigorous Modeling of Scattered LIght in EUV Cameras", 2001 International Microprocesses and Nanotechnology Conference, Oct. 31, 2001, p. 14.*

(Continued)

*Primary Examiner*—Phallaka Kik
(74) *Attorney, Agent, or Firm*—Pillsbury Winthrop Shaw Pittman LLP

(57) ABSTRACT

A method of generating a mask of use in printing a target pattern on a substrate. The method includes the steps of (a) determining a maximum width of features to be imaged on the substrate utilizing phase-structures formed in the mask; (b) identifying all features contained in the target pattern having a width which is equal to or less than the maximum width; (c) extracting all features having a width which is equal to or less than the maximum width from the target pattern; (d) forming phase-structures in the mask corresponding to all features identified in step (b); and (e) forming opaque structures in the mask for all features remaining in target pattern after performing step (c).

13 Claims, 8 Drawing Sheets

U.S. PATENT DOCUMENTS

| | | | |
|---|---|---|---|
| 5,446,521 | A | 8/1995 | Hainsey et al. |
| 5,881,125 | A | 3/1999 | Dao |
| 5,885,735 | A * | 3/1999 | Imai et al. .................. 430/5 |
| 5,923,562 | A | 7/1999 | Liebmann et al. |
| 6,114,071 | A | 9/2000 | Chen et al. |
| 6,255,024 | B1 | 7/2001 | Pierrat |
| 6,258,493 | B1 | 7/2001 | Wang et al. |
| 6,268,091 | B1 | 7/2001 | Pierrat |
| 6,338,922 | B1 * | 1/2002 | Liebmann et al. ............ 430/5 |
| 6,340,543 | B1 | 1/2002 | Nagamura et al. |
| 6,482,555 | B2 | 11/2002 | Chen et al. |
| 6,500,587 | B1 * | 12/2002 | Ghandehari et al. ........... 430/5 |
| 6,541,167 | B2 | 4/2003 | Petersen et al. |
| 6,544,694 | B2 * | 4/2003 | Dirksen et al. ................ 430/5 |
| 6,548,417 | B2 * | 4/2003 | Dao et al. .................. 438/710 |
| 6,553,562 | B2 | 4/2003 | Capodieci et al. |
| 6,607,863 | B2 * | 8/2003 | Irie .............................. 430/30 |
| 6,625,802 | B2 * | 9/2003 | Singh et al. ................... 716/21 |
| 6,660,649 | B2 * | 12/2003 | Dao et al. .................. 438/717 |
| 6,750,000 | B2 * | 6/2004 | Tanaka et al. .............. 430/394 |
| 6,757,886 | B2 | 6/2004 | Liebmann et al. |
| 6,815,129 | B1 * | 11/2004 | Bjorkholm et al. ........... 430/30 |
| 6,851,103 | B2 * | 2/2005 | Van Den Broeke et al. ... 716/21 |
| 2001/0018153 | A1 * | 8/2001 | Irie .............................. 430/5 |
| 2001/0021476 | A1 | 9/2001 | Gans et al. |
| 2001/0021477 | A1 | 9/2001 | Dirksen et al. |
| 2001/0033995 | A1 * | 10/2001 | Tanaka et al. .............. 430/311 |
| 2002/0015899 | A1 | 2/2002 | Chen et al. |
| 2002/0083410 | A1 | 6/2002 | Wu et al. |
| 2002/0122994 | A1 | 9/2002 | Cote et al. |
| 2003/0014727 | A1 * | 1/2003 | Roohparvar ................. 716/13 |
| 2003/0027057 | A1 | 2/2003 | Schroeder et al. |
| 2003/0054260 | A1 * | 3/2003 | Dao et al. ...................... 430/5 |
| 2003/0054262 | A1 * | 3/2003 | Dao et al. ...................... 430/5 |
| 2003/0093766 | A1 | 5/2003 | Liebmann et al. |
| 2003/0149956 | A1 * | 8/2003 | Singh et al. ................... 716/21 |
| 2004/0010770 | A1 * | 1/2004 | Broeke et al. ................. 716/21 |
| 2004/0025140 | A1 * | 2/2004 | Singh et al. ................... 716/21 |
| 2004/0043307 | A1 * | 3/2004 | Tanaka et al. .................. 430/5 |
| 2004/0121244 | A1 | 6/2004 | Misaka |
| 2004/0017635 | A1 | 9/2004 | Liebmann et al. |

FOREIGN PATENT DOCUMENTS

| | | |
|---|---|---|
| JP | 07-152144 | 6/1995 |
| JP | 09-127677 | 5/1997 |
| JP | 2001-183806 | 7/2001 |
| JP | 2001-222097 | 8/2001 |
| JP | 2001-356466 | 12/2001 |

OTHER PUBLICATIONS

Foreign Office Action, and English translation thereof, dated Apr. 23, 2007 for JP Patent Application No. 2003-124535.

Australian Search Report issued in corresponding Australian Patent Application No. SG 200301491-7, dated Oct. 20, 2004, together with Written Opinion thereof.

Fung Cheng J et al., "Mask Design Optimization For 70nm Technology Node using Chromeless Phase Lithography (CPL) Based On 100% Transmission Phase Shifting Mask", Proceedings of SPIE, SPIE. Bellingham, VA, US, vol. 4754, pp. 361-372, Apr. 23-25, 2002.

Fung Chen J et al., Binary Halftone Chromeless Psm Technology For Lambda/4 Optical Lithography, Optical Microlithography XIV, Santa Clara, CA, USA, Feb. 27-Mar. 2, 2001 Proceedings of SPIE—the International Society for Optical Engineering, vol. 4346, pt. 1-2 (2001), pp. 515-533.

Hsu C et al, "Patterning Half-Wavelength Dram Cell Using Chromeless Phase Lithography (CPL)", Proceedings of SPIE, SPIE, Bellingham, VA, US, vol. 4691, Mar. 5, 2002, pp. 76-81, 82-88.

Van Den Broeke D., et al., "Complex 2d Pattern Lithography At Lambda/4 Resolution Using Chromeless Phase Lithography (CPL)", Optical Microlithography XV, Santa Clara, CA USA, 2002, vol. 4691, pp. 196-214, Mar. 3-5, 2002.

Australian Search Report with Written Opinion issued in corresponding Singapore Patent Application No. SG 200608891-8, dated Oct. 26, 2007.

* cited by examiner

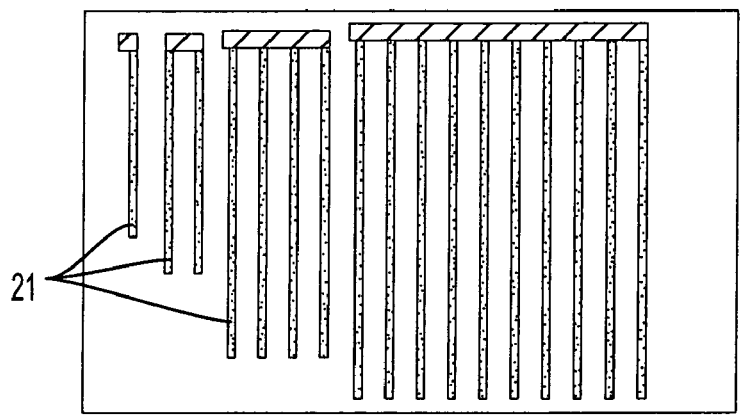
FIG. 2a
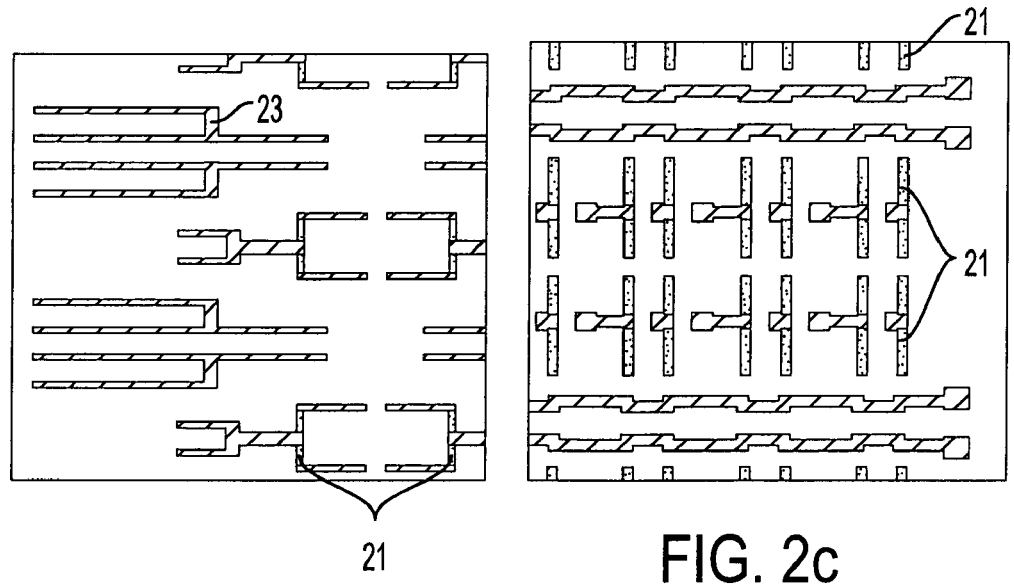
FIG. 2b
FIG. 2c

METHOD AND APPARATUS FOR DECOMPOSING SEMICONDUCTOR DEVICE PATTERNS INTO PHASE AND CHROME REGIONS FOR CHROMELESS PHASE LITHOGRAPHY

RELATED APPLICATION

This application is a divisional of application No. 10/395,903 filed Mar. 25, 2003, which is now U.S. Pat. No. 6,851,103, and which claims priority to U.S. Provisional Application No. 60/366,545 filed Mar. 25, 2002.

FIELD OF THE INVENTION

The present invention relates generally to the generation of mask patterns for use with chromeless phase lithography techniques, and more specifically, for the decomposition of a target design into a corresponding mask pattern that prints features utilizing both chrome and phase-shift techniques. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5-10 years, as described in the International Technology Roadmap for Semiconductors (ITRS 2000).

One technique, which is currently receiving additional attention from the photolithography community, for further improving the resolution/printing capabilities of photolithography equipment is referred to as chromeless phase lithography "CPL". As is known, when utilizing CPL techniques, the resulting mask pattern typically includes structures (corresponding to features to be printed on the wafer) which do not require the use of chrome (i.e., the features are printed by phase-shift techniques) as well as those that utilize chrome.

As a result, it is necessary for mask designers to verify that the mask structures utilizing the various techniques all interact in an acceptable manner such that the desired pattern is printed on the wafer. However, due to the complexity of the masks, this can be a long, tedious and difficult process.

Accordingly, there exists a need for a method which provides a simple and systematic approach for defining a mask pattern that utilizes CPL techniques, which allows for accurate printing of the desired pattern.

SUMMARY OF THE INVENTION

In an effort to solve the foregoing needs, it is one object of the present invention to provide a method for generating a mask pattern that utilizes CPL techniques from a desired target pattern or design. Importantly, it is an object to provide a simple and systematic process for converting the desired target pattern into a mask pattern that reduces the time required for mask design, while at the same time improving the accuracy of the design printed on the wafer.

More specifically, in one exemplary embodiment, the present invention relates to a method of generating a mask of use in printing a target pattern on a substrate. The method includes the steps of (a) determining a maximum width of features to be imaged on the substrate utilizing phase-structures formed in the mask; (b) identifying all features contained in the target pattern having a width which is equal to or less than the maximum width; (c) extracting all features having a width which is equal to or less than the maximum width from the target pattern; (d) forming phase-structures in the mask corresponding to all features identified in step (b); and (e) forming opaque structures in the mask for all features remaining in target pattern after performing step (c).

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. For example, the foregoing method of decomposing a target pattern into phase structures and opaque structures in order to define/generate a mask to be utilized to print the target pattern provides a simple and systematic process for converting the target pattern into a mask pattern that reduces the time required for mask design, while at the same time improving the accuracy of the design printed on the wafer.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIGS. 2a-2c illustrate three exemplary patterns and the identification of the vertical features which are then extracted from the pattern.

DETAILED DESCRIPTION OF THE INVENTION

As explained in more detail below, the preferred embodiment of the present invention relates to a process for decomposing a desired target pattern (to be printed on a wafer) so as to produce a mask pattern (i.e., reticle) that can be utilized to image the wafer/substrate and generate the target pattern thereon. In accordance with the present invention, the mask pattern to be generated utilizes CPL techniques. As such, the mask pattern will include areas that are approximately 100% transmission and zero phase shift; areas that are approximately 100% transmission and 180° phase-shift; and areas that are approximately 0% transmission. Due to these various different types of areas utilized to print features when utilizing CPL techniques in combination with the complexity of typical masks, mask design can be a difficult and time extensive task. As explained in detail below, the present invention reduces the time required for mask generation by providing a simple decomposition process which can be utilized to generate a mask pattern directly from the target pattern. Moreover, it is noted that the method of the present invention can be performed utilizing a standard CAD system (such as those noted above), which is programmed to operate in accordance with the following description.

Figure 1:
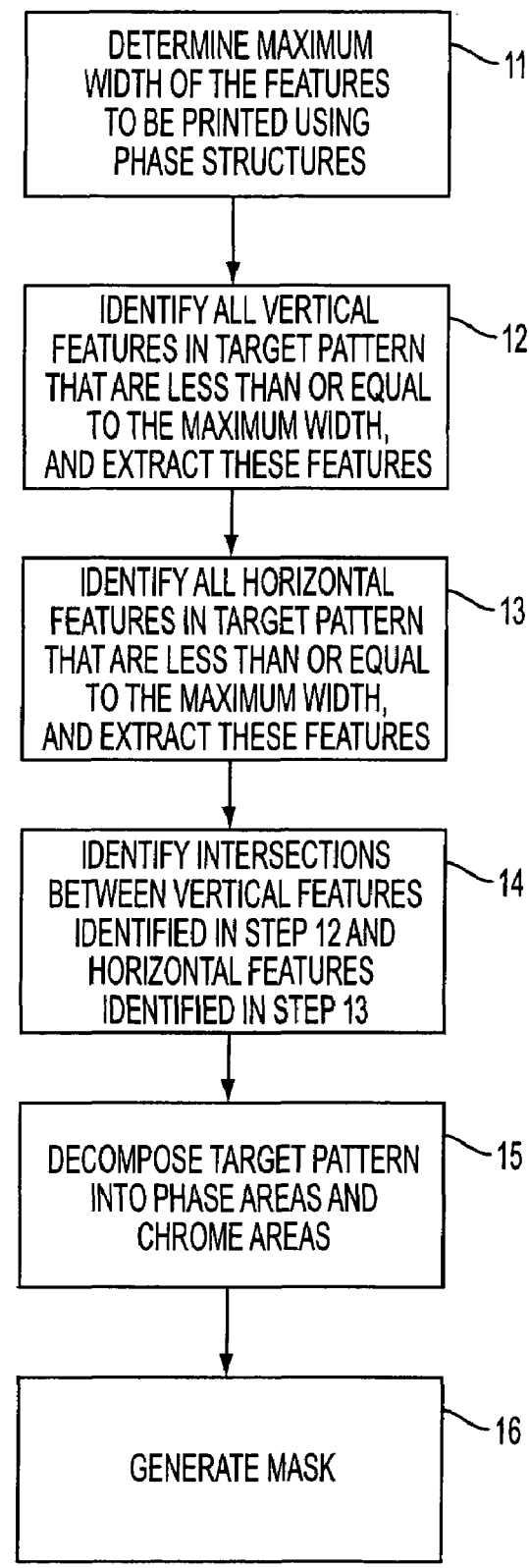
FIG. 1 is an exemplary flowchart illustrating one embodiment of the present invention.

FIG. 1 is a flowchart which generally illustrates the mask generation process of the present invention. As noted above, when utilizing CPL techniques, the resultant mask is capable of printing features utilizing, for example, phase-shifts or phase edges formed in the mask reticle (i.e., no chrome) and of printing features utilizing at least in-part chrome structures contained in the mask. Referring to FIG. 1, the first step, Step 11, in the process is to determine the maximum width of the features that can be printed utilizing phase-structures (i.e., no chrome). In other words, it is necessary to define the feature width at which it is necessary to incorporate the use of chrome to accurately reproduce the feature on the wafer. This maximum width, which can be determined based on the imaging system parameters, such as, but not limited to wavelength, numerical aperture, illumination and wafer stepper conditions, is readily determinable by known methods such as the use of an aerial image simulator. Specifically, by utilizing an aerial image simulator it is possible to determine at what width of the phase structure the image begins to degrade. The maximum width would be set to less than this degradation point. The maximum width can also be determined based on a definition of the critical features within the desired pattern, such as, minimum feature size, minimum pitch and maximum duty cycle. To determine the maximum width based on the critical features, the maximum phase size is set such that all the critical minimum features fall within the phase area. Then, utilizing this width, the illumination settings that provide acceptable imaging results for this phase size width are determined. This is also done with an aerial image simulator. In other words, the illumination is fixed and the maximum width is determined, or from the critical geometry the maximum width is fixed, and then the necessary illumination is determined. Thus, in Step 11, the maximum width of the features that can be printed utilizing phase-shift techniques is determined. Any features exceeding this width must utilize chrome for proper imaging on the wafer.

Next, in Step 12, the target pattern is examined and all vertical components/features that are equal to or less than the maximum width are identified and extracted from the original design. FIGS. 2a-2c illustrate three exemplary patterns and the identification of the vertical features which are then extracted from the pattern. As shown in each of FIGS. 2a-2c, the vertical features 21 correspond to vertical features that are equal to or less than the maximum width determined in Step 11, and are therefore extracted from the original design (i.e., target pattern) into a separate pattern, referred to as Pattern A. As shown in FIG. 2b, the vertical features which exceed the maximum width (see, e.g., vertical feature 23) are not extracted. It is noted that the features extracted and placed in Pattern A are capable of being printed utilizing phase-structures. It is further noted that once identified, the vertical features 21 can be extracted from the target pattern utilizing commonly known Boolean operations.

Figure 3A:
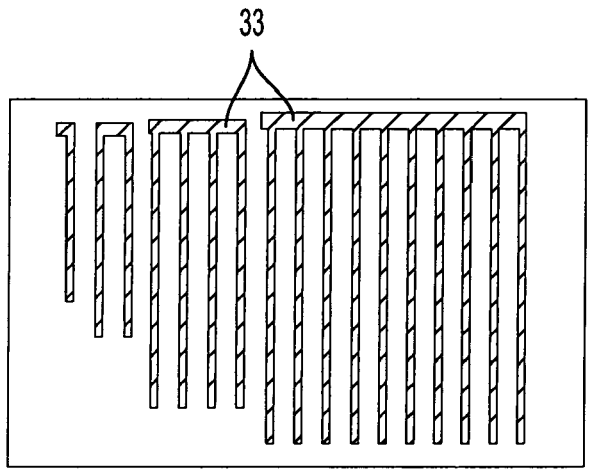
FIGS. 3a-3c correspond to the patterns illustrated in FIG. 2a-2c, respectively, and illustrate the horizontal features to be extracted from the pattern.
Figure 3B:
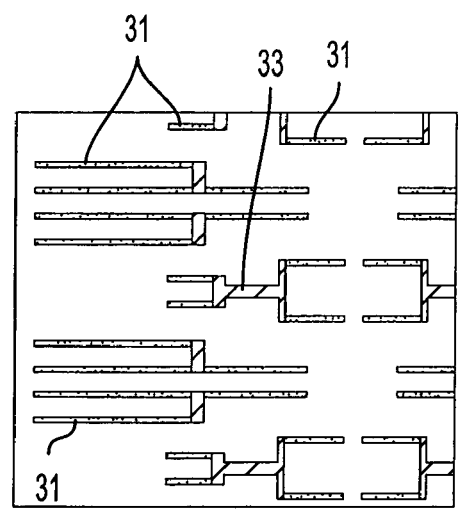
Figure 3C:
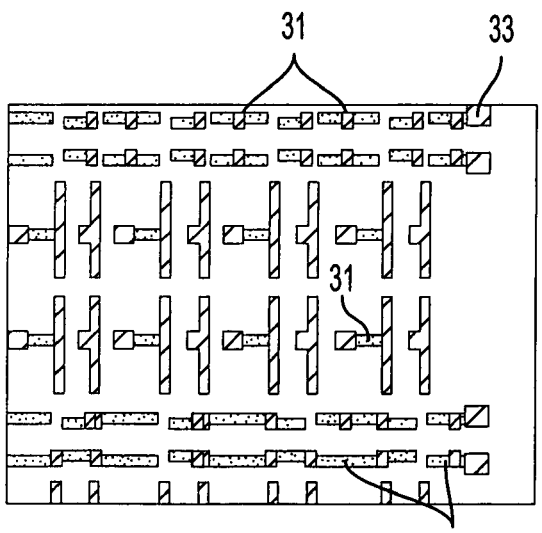

Similarly, in Step 13, all of the horizontal components/features that are equal to or less than the maximum width are identified and extracted from the target pattern. FIGS. 3a-3c correspond to the patterns illustrated in FIG. 2a-2c, respectively. As shown in each of FIGS. 3b-3c, the horizontal features 31 correspond to horizontal features that are equal to or less than the maximum width determined in Step 11, and are therefore extracted from the original design to a separate pattern, referred to as Pattern B. As shown in FIGS. 3a-3c, the horizontal features which exceed the maximum width (see, e.g., horizontal features 33) are not extracted. It is noted that the features extracted and placed in Pattern B are capable of being printed utilizing phase-structures. It is further noted that once identified, the horizontal features 31 can be extracted from the original pattern utilizing commonly known Boolean operations.

The next step in the process, Step 14, entails identifying the intersections between the vertical features 21 and the horizontal features 31 that will be printed utilizing phase-structures. As explained further below, it is sometimes necessary to identify such intersections such that the size of the chrome applied at the intersections can be controlled independently from the application of chrome to other patterns. Step 14, which is an optional step in the process, is sometimes required in order to ensure that the intersections are printed correctly on the substrate (i.e., without a break in the line). The identification of the intersections is performed as follows. First, the vertical features contained in Pattern A are increased in length along the vertical direction at both ends of each feature. Second, the horizontal features contained in Pattern B are increased in length along the horizontal direction at both ends of each feature. The increase in size of the vertical and horizontal features contained in Patterns A and B is necessary to ensure the intersection is properly identified. For example, assuming an "L" shaped feature, when extracting the vertical portion (or horizontal portion) of this feature, the portion of the vertical feature that also forms part of the intersection is lost (i.e., it is not extracted). By extending the length of the vertical feature by some predetermined amount, the portion of the vertical feature that resides in the intersection is recaptured. The foregoing is the same for the horizontal features. It is noted that both the vertical and horizontal features are preferably extended by the same amount. It is further noted that a general rule regarding the amount of the increase is 2 times the maximum phase width.

Figure 4A:
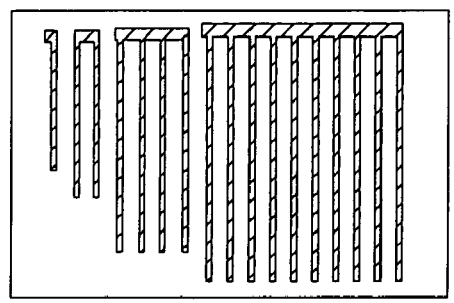
FIGS. 4a-4c illustrate the areas of intersection between the vertical and horizontal patterns extracted in FIGS. 2a-2c and FIGS. 3a-3c, respectively.
Figure 4B:
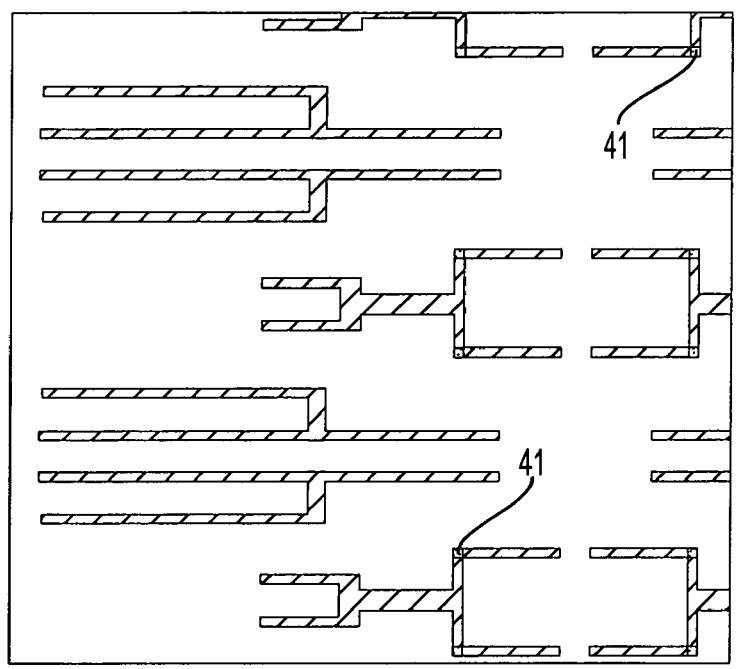
Figure 4C:
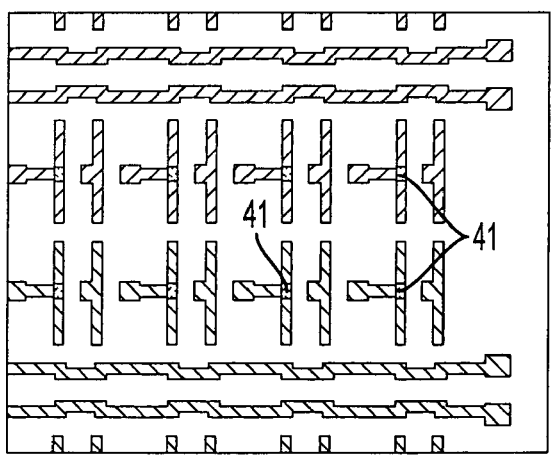

Continuing, once the vertical features in Pattern A and the horizontal features in Pattern B are extended, a Boolean "AND" operation is performed utilizing Pattern A and Pattern B, the result of which (referred to as Pattern C) identifies the intersections between the vertical features and horizontal features to be printed utilizing phase structures. The result of this operation for the exemplary patterns set forth in FIGS. 2a-2c and 3a-3c is illustrated in FIGS. 4a-4c, respectively. More specifically, referring to FIG. 4a, there are no intersections identified, as the corresponding horizontal pattern set forth in FIG. 3a did not have any horizontal features to be printed utilizing phase-structures. Reference number 41 in FIGS. 4b and 4c illustrate the intersections between the vertical and horizontal features identified in FIGS. 2b and 3b, and FIGS. 2c and 3c, respectively. It is noted that after separating the intersections from the rest of the target pattern, additional treatments, such as sizing, can be applied to the chrome intersection pattern.

Next, once the foregoing process is performed, the next step, Step 15, entails decomposing the pattern into phase areas (e.g., 100% transmission and 180° phase-shift) and opaque areas (e.g., zero transmission). It is noted that the foregoing requirements regarding phase areas are only exemplary, other conditions suitable for printing the phase structures can be utilized. For example, it is possible that the method may utilize 25% transmission, or 50% transmission, or provide multiple transmissions on the photomask. With regard to the decomposition, first, the phase pattern is defined by performing a Boolean "OR" operation of Pattern A and Pattern B. The result of this "OR" operation (which is referred to as Pattern D) is a pattern containing both the vertical and horizontal features to be printed utilizing only phase structures (i.e., no chrome). Second, the portion of the original pattern which is not to be printed utilizing phase structures and which is not an intersection between vertical and horizontal phase structures is identified by subtracting Pattern D and Pattern C from the original pattern. The resulting pattern, which is referred to as Pattern E, can be obtained by performing the following Boolean operation: Pattern E=the "original pattern"—(Pattern C "OR" Pattern D). As such, Pattern E represents those portions of the pattern that will be printed utilizing zero transmission features on the mask (i.e., chrome features).

Thus, once the foregoing step is complete, the following three distinct portions of the mask have been defined: (1) Pattern D—the vertical and horizontal features that are to be printed utilizing phase structures, (2) Pattern C—the intersections between the vertical and horizontal features to be printed utilizing opaque structures (i.e., zero transmission structures) and (3) Pattern E—all of the other features contained in the original design pattern not contained in Pattern C or D. It is noted that Pattern C and Pattern E can be combined into a single pattern as all of the features contained in each pattern are printed with an opaque feature (i.e., zero transmission). The combination of Pattern C and E is referred to as Pattern F.

Figure 5A:
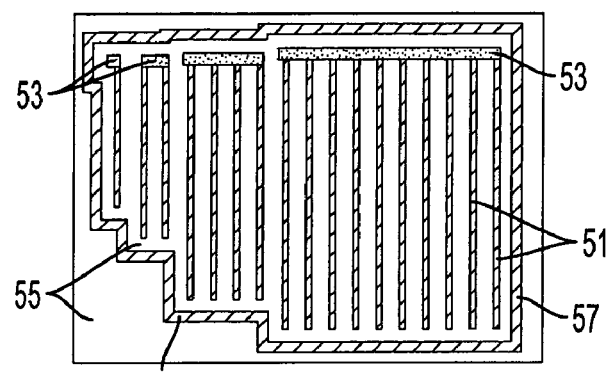
FIGS. 5a-5c represent the corresponding final mask design for the corresponding patterns set forth in FIGS. 2a, 3a and 4a; 2b, 3b and 4b; and 2c, 3c and 4c, respectively.
Figure 5B:
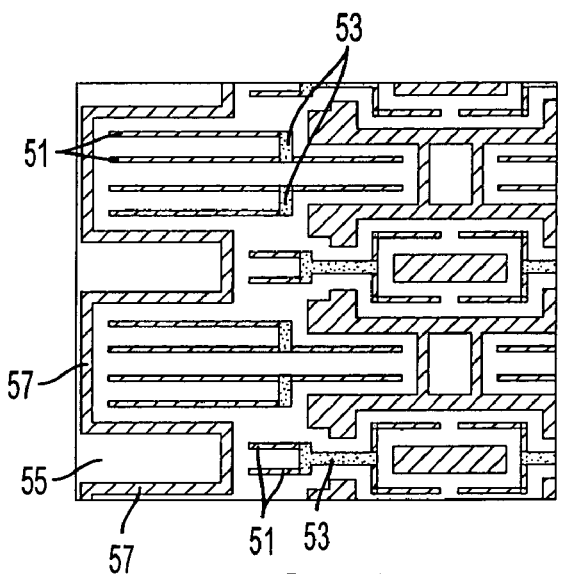
Figure 5C:
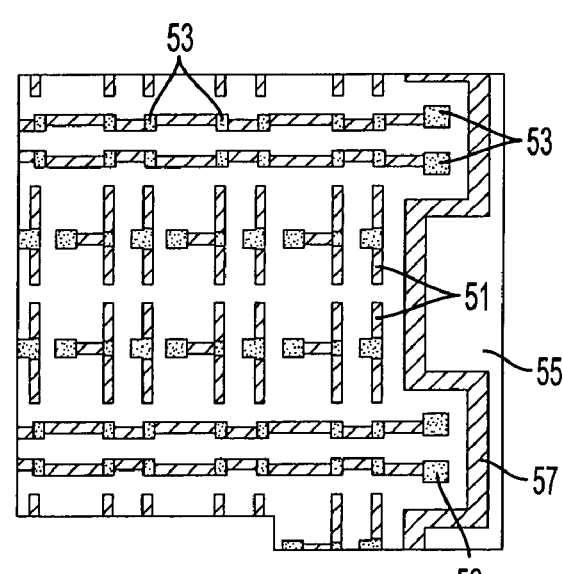

In the final step, the foregoing patterns are utilized to generate the mask to be utilized to image the desired pattern on the substrate. More specifically, Pattern D and Pattern F are combined to form a single mask, which can be accomplished utilizing a Boolean "ADD" operation. Referring to FIGS. 5a-5c, which represent the corresponding final mask design for the corresponding patterns set forth in FIGS. 2a, 3a and 4a; 2b, 3b and 4b; and 2c, 3c and 4c, respectively, the final mask contains phase structures 51 for printing the vertical and horizontal component having a width suitable for printing with phase structures, and opaque structures 53 for printing components not suitable for printing with phase structures as well as the intersections between the vertical and horizontal components to be printed with opaque structures. In the exemplary embodiment, the background area 55 contained in the mask of FIG. 5c is defined as 100% transmission and 0° phase-shift, the phase-structures 51 are defined as 100% transmission and 180° phase-shift, and the opaque structures 53 are defined as 0% transmission. It is noted that the background portion of the mask operates in conjunction with the phase structures 51 in order to print the vertical and horizontal components set forth in Pattern D. It is further noted that the foregoing method of the present invention is not intended to be limited to the specific transmission and phase-shift characteristics set forth above. It is clear that variations from the foregoing are possible.

It is also possible to utilize optical proximity correction techniques or edge biases in conjunction with the method of the present invention. For example, it is possible to incorporate the use of scattering bars into the resultant mask design. Moreover, the scattering bars can be introduced into the mask design at various steps in the process. As is known, scattering bars can be constructed as opaque scattering bars or as phase-edge scattering bars. One of the important requirements is that the scattering bars remain sub-resolution. FIGS. 5a-5c illustrate exemplary scattering bars 57 incorporated into the final mask design.

As noted above, the foregoing method of decomposing a target pattern into phase structures and opaque structures in order to define/generate a mask to be utilized to print the target pattern provides a simple and systematic process for converting the target pattern into a mask pattern that reduces the time required for mask design, while at the same time improving the accuracy of the design printed on the wafer.

Another aspect of the present invention relates to a further modification of the mask pattern in order to reduce the effects of "flare" in the imaged substrate. As is known, "flare" corresponds to unwanted background light that degrades the aerial image at the image plane (i.e., typically, the surface of the wafer). However, flare effects are long range (i.e., the amount of flare at a given point is dependent on a large area around the given point) and therefore cannot be corrected for by utilizing traditional OPC methods. Some current theories regarding the causes of flare are: scattering of light within the optical system; the contrast of the aerial image and un-cancelled zero order light. It is noted that the background light or flare that is impacting a specific geometry is coming from a large region around the geometry, not the geometry itself. Thus, a reduction of the intensity of the energy in the large bright areas of the pattern by as little as 30% can have a very large positive effect on the reduction of the unwanted flare component.

The following sets forth various methods for reducing the flare component from the aerial image. Prior to discussing the methods, it is noted that the following techniques would be implemented on the large portions of the mask that do not contain features or components to be printed. For example, referring to FIGS. 6a-6c, the following modification would be implemented in portions of the mask outside of the portions shown in these figures.

Figure 6A:
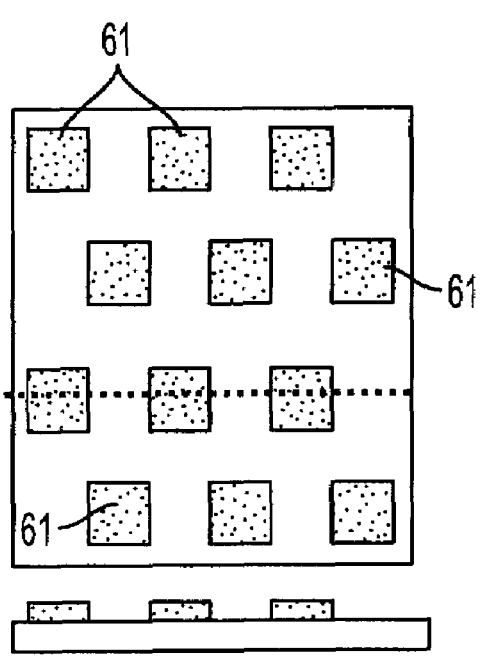
FIGS. 6a-6c illustrate various sub-resolution patterns capable of reducing flare.
Figure 6B:
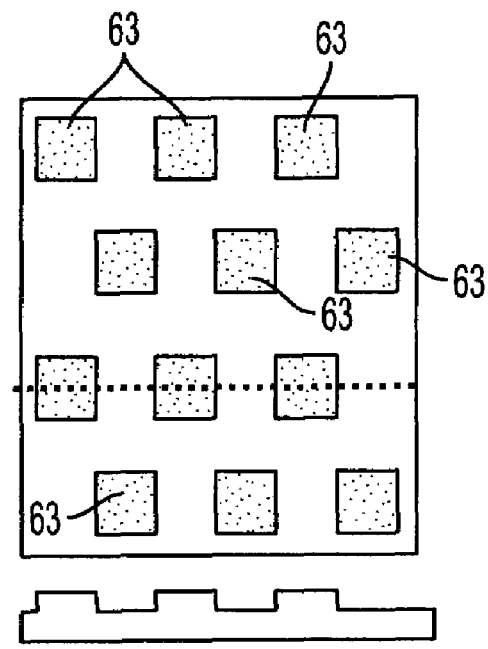
Figure 6C:
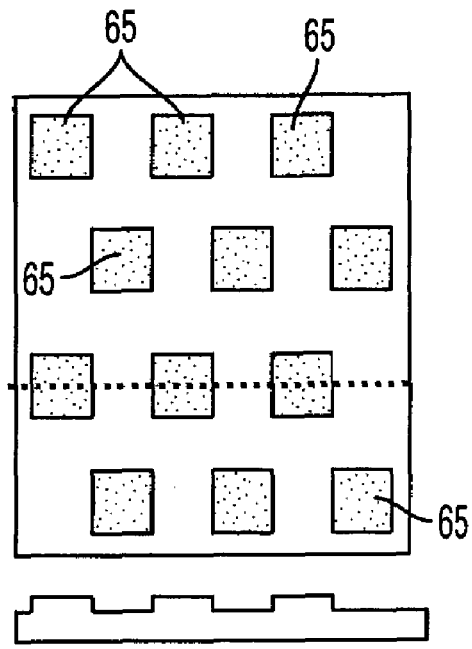

In accordance with the first method referring to FIG. 6a, sub-resolution opaque patterns are added to the mask pattern in portions corresponding to the open areas of the design (e.g., areas that are 200 nm or more away from any pattern geometry). As shown in the figure, a checkerboard pattern of chrome features 61 that fills the open space by 25% functions to reduce the intensity in the field area to approximately 82% of the incident intensity. In a second method, as shown in FIG. 6b, a checkerboard pattern of 180° phase-shifted features 63 that fills the open space by 25% is added to the open area. This pattern functions to reduce the intensity in the field area to approximately 35% of the incident intensity. In a third method, as shown in FIG. 6c, a checkerboard pattern of 120° phase-shifted features 65 that fills the open space by 25% is added to the open area. This pattern functions to reduce the intensity in the field area to approximately 75% of the incident intensity. It is noted that the intensity of energy on the large field area is directly dependent on the percentage of fill in the flare reduction pattern.

Figure 7:
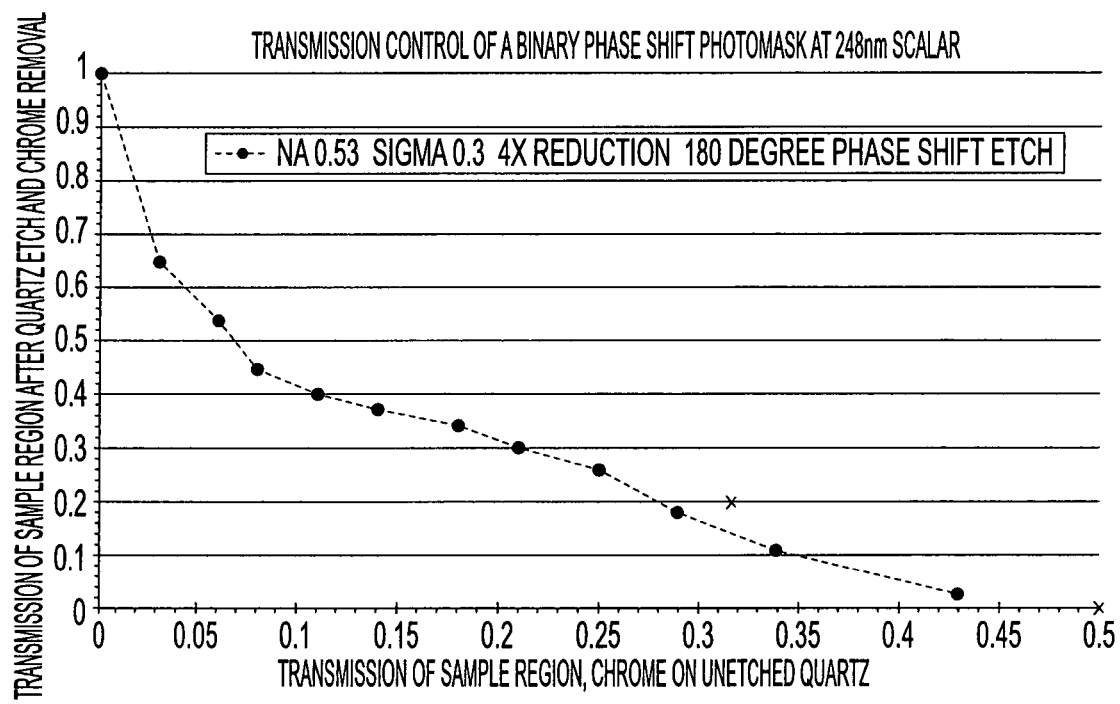
FIG. 7 illustrates the relationship between the percentage transmission of a chrome sub-resolution pattern and the same pattern consisting of 180° phase-structures.

FIG. 7 illustrates the relationship between the percentage transmission of a chrome sub-resolution pattern and the same pattern consisting of 180° phase-structures. As shown, when a chrome pattern transmits 50% of the incident light, the same pattern of 180° phase-shift, 100% transmission features will have zero intensity.

It is further noted that the foregoing checkerboard pattern and amounts of phase-shifting or use of chrome are merely exemplary. Variations of the foregoing can be performed until the desired amount of flare reduction is obtained. For example, the possible patterns could include, but are not limited to: line/space patterns, rectangular checkerboard, alternating horizontal and vertical lines, conforming line/ space pattern, etc. The important aspect is that the features contained in the flare reduction pattern remain sub-resolution.

Figure 8:
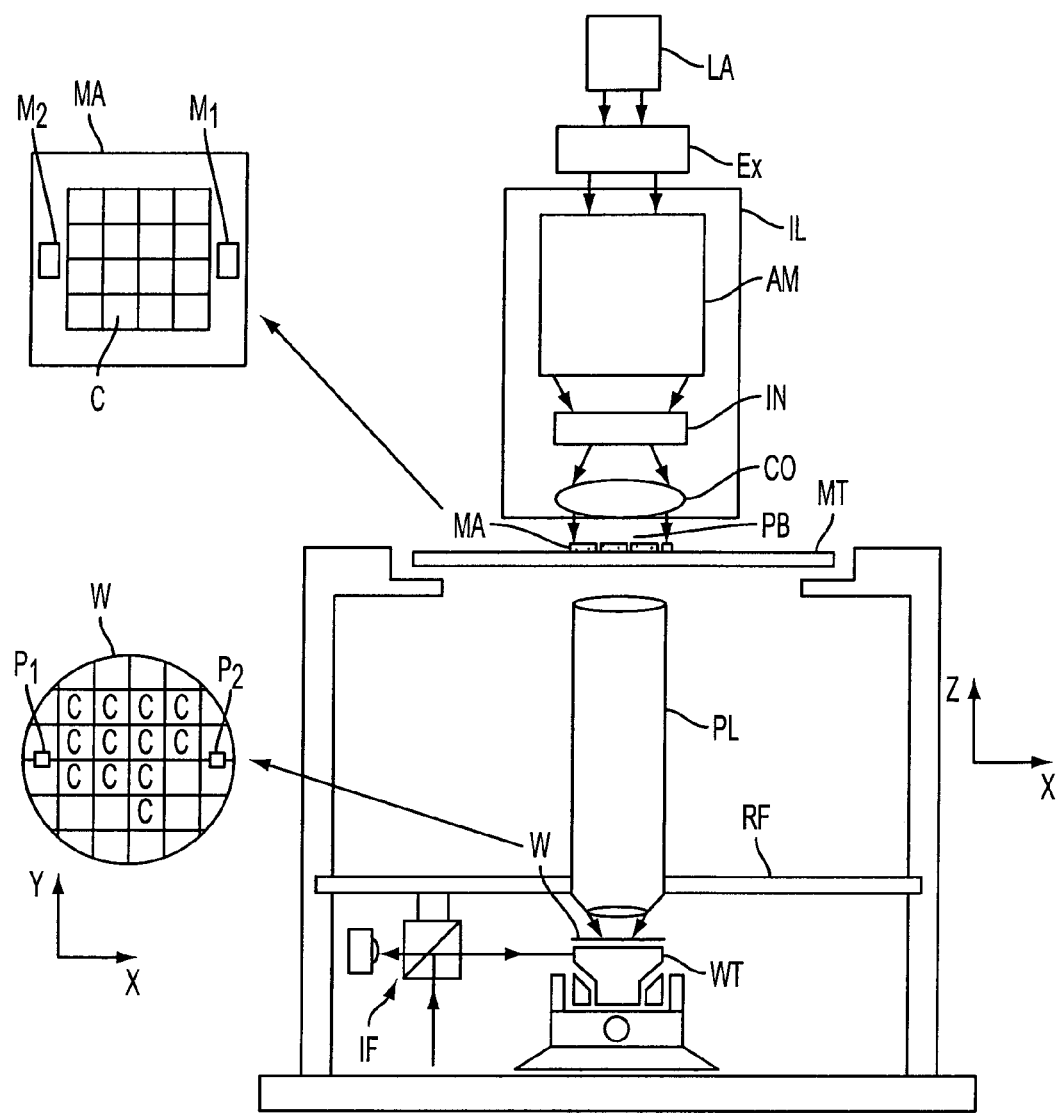
FIG. 8 schematically depicts a lithographic projection apparatus suitable for use with the masks designed with the aid of the current invention.

FIG. 8 schematically depicts a lithographic projection apparatus suitable for use with the masks designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of forming a mask for optically transferring a target pattern to a substrate, said method comprising the steps of:
   - generating a mask pattern representing said target pattern to be imaged on said substrate;
   - identifying open areas in said mask pattern which do not contain any features of said target pattern to be imaged on said substrate;
   - modifying said mask pattern to contain a plurality of sub-resolution flare reduction features in said open areas, said plurality of sub-resolution flare reduction features comprising chromeless phase-shifting structures and partially reducing the amount of light passing through said open areas in said mask pattern; and forming the mask based on said modified mask pattern.

2. The method of claim 1, wherein said plurality of sub-resolution flare reduction features are arranged so as to form a checkerboard pattern.

3. The method of claim 1, wherein said plurality of sub-resolution flare reduction features are arranged so as to form a line-space pattern.

4. The method of claim 1, wherein said sub-resolution flare reduction features occupy 25% of the total area of the open area.

5. An apparatus for forming a mask pattern for optically transferring a target pattern to a substrate, said method comprising the steps of:
   - means for generating a mask pattern representing said target pattern to be imaged on said substrate;
   - means for identifying open areas in said mask pattern which do not contain any features of said target pattern to be imaged on said substrate; and
   - means for modifying said mask pattern to contain a plurality of sub-resolution flare reduction features in said open areas, said plurality of sub-resolution flare reduction features comprising chromeless phase-shifting structures and partially reducing the amount of light passing through said open areas in said mask pattern.

6. The apparatus of claim 5, wherein said plurality of sub-resolution flare reduction features are arranged so as to form a checkerboard pattern.

7. The apparatus of claim 5, wherein said plurality of sub-resolution flare reduction features are arranged so as to form a line-space pattern.

8. The apparatus of claim 5, wherein said sub-resolution flare reduction features occupy 25% of the total area of the open area.

9. A computer readable medium for controlling a device for generating a mask for imaging a target pattern having a plurality of features, the process of generating said mask comprising the steps of:

generating a mask pattern representing said target pattern to be imaged on said substrate; identifying open areas in said mask pattern which do not contain any features of said target pattern to be imaged on said substrate; and modifying said mask pattern to contain a plurality of sub-resolution flare reduction features in said open areas, said plurality of sub-resolution flare reduction features comprising chromeless phase-shifting structures and partially reducing the amount of light passing through said open areas in said mask pattern.

10. The computer readable medium of claim 9, wherein said plurality of subresolution flare reduction features are arranged so as to form a checkerboard pattern.

11. The computer readable medium of claim 9, wherein said plurality of subresolution flare reduction features are arranged so as to form a line-space pattern.

12. The computer readable medium of claim 9, wherein said sub-resolution flare reduction features occupy 25% of the total area of the open area.

13. A device manufacturing method comprising the steps of:
(a) providing a substrate that is at least partially covered by a layer of radiation-sensitive material;
(b) providing a projection beam of radiation using an imaging system;
(c) generating a mask utilized to endow the projection beam with a pattern in its crosssection;
(d) projecting the patterned beam of radiation onto a target portion of the layer of radiation-sensitive material,
wherein, in step (c), said mask is formed by a method comprising the steps of:
generating a mask pattern representing said target pattern to be imaged on said substrate;
identifying open areas in said mask pattern which do not contain any features of said target pattern to be imaged on said substrate; and
modifying said mask pattern to contain a plurality of sub-resolution flare reduction features in said open areas, said plurality of sub-resolution flare reduction features comprising chromeless phase-shifting structures and partially reducing the amount of light passing through said open areas in said mask pattern.

* * * * *